United States Patent [19]

Chambers et al.

[11] 4,144,097
[45] Mar. 13, 1979

[54] LUMINESCENT SOLAR COLLECTOR

[75] Inventors: Robert R. Chambers, Studio City; Peter G. Wohlmut, Palo Alto, both of Calif.

[73] Assignee: Atlantic Richfield Company, Los Angeles, Calif.

[21] Appl. No.: 897,630

[22] Filed: Apr. 19, 1978

[51] Int. Cl.$^2$ .......................................... H01L 31/04
[52] U.S. Cl. .......................... 136/89 PC; 136/89 HY
[58] Field of Search ....................... 136/89 PC, 89 HY

[56] References Cited
PUBLICATIONS

P. B. Mauer et al., "Fluorescent Solar Energy Concentrator", *Research Disclosure*, pp. 43–44, Oct. 1977.
P. B. Mauer et al., "Flourescent Concentrator for Solar Energy Collection", *Research Disclosure*, Jan. 1976, p. 20.

*Primary Examiner*—Aaron Weisstuch
*Attorney, Agent, or Firm*—Roderick W. MacDonald

[57] ABSTRACT

A luminescent solar collector comprising a light transmitting member which carries at least one photovoltaic means, a luminescent member removably attached to the light transmitting member, and interface material between the two members assuring the transmission of light between said members. A method for increasing the efficiency of a luminescent photovoltaic device which contains a luminescent member of reduced efficiency comprising attaching to the low efficiency luminescent member a higher efficiency luminescent member with an interface material, the interface material assuring transmission of light from one luminescent member to the other.

15 Claims, 5 Drawing Figures

LUMINESCENT SOLAR COLLECTOR

BACKGROUND OF THE INVENTION

It is known that a photovoltaic semiconductor p-n junction can convert to electricity only that portion of the incident photon energy spectrum, typically solar radiation, which creates hole-electron pairs within a given semiconductor material. For example, in a silicon photovoltaic cell only that portion of the solar spectrum with energy in the vicinity of the 1.1 electron volts per photon and which exceeds the band gap energy of silicon is converted into electricity. Photons of lesser energy do not generate electricity. More energetic photons are strongly absorbed but much of the energy is lost in heating the cell, which heat can degrade the cell's energy conversion efficiency. To maximize the efficiency of a given photovoltaic cell, it is advantageous to convert as much of the available light as possible into an energy range to which such cell can respond in the generation of electricity before the light strikes the cell's surface.

One technique for achieving such conversion takes advantage of the fact that light falling upon a luminescent agent is characteristically reradiated or emitted in a narrow band of wavelengths of known energy content. Also, light absorbed by such an agent in one direction is reradiated in random directions. Such agents include, for example, pigments such as metal oxides and organic dyes which are used in scintillation counters, lasers, and the like. For the purpose of this invention the term "luminescent agent" includes all types of luminescent agents exhibiting all species of luminescence, including, but not limited to, fluorescence and phosphorescence.

It has been shown that the dispersal of a luminescent agent within an internally reflective sheet of transparent glass or plastic, one of whose major surfaces is exposed to light, concentrates and focuses a flux of light of known energy level toward one or more of the thin upstanding edge faces of the sheet. If a photovoltaic cell responsive to light at that energy level is optically coupled to such edge face, the energy conversion efficiency of the cell increases several times. In this invention, a light transmissive member of such construction and properties is termed a "luminescent member" and a photovoltaic solar collector employing such a member is termed a "luminescent solar collector". A luminescent solar collector of this type is fully and completely disclosed in *Optics*, Vol. 15, No. 10, pages 2299-2300, dated October, 1976, the disclosure of which is incorporated herein by reference.

This invention addresses the difficulty and expense of finding a luminescent agent or agents which have all of the desired properties for a solar collector application. The optimum luminescent agent absorbs over a very broad range of visible light and emits at a wavelength at or just slightly shorter than the band gap of the photovoltaic cell employed. It is important to the efficiency of the solar device that the luminescent agent not absorb the emitted light at all, or at least very little. It is difficult to find a luminescent agent which covers a broad part of the light spectrum, so in practice a plurality of luminescent agents have been employed, as in U.S. Pat. No. 3,912,931. It is also difficult to find a luminescent agent that does not absorb, at least to some extent, in the same light region where that agent also emits light. That is to say the agent reabsorbs light emitted by another particle of the same agent, and this results in scattering of the emitted radiation more than necessary or desired and the loss of some of this scattered radiation out of the collector or conversion into heat.

When a plurality of luminescent agents are employed in the same collector, the situation becomes even more complicated because it then becomes even more difficult to select groups of agents which interact in just the desired way. Further, beyond the optical requirements, all luminescent agents employed have to be compatible with one another and the materials employed in the member of the collector which contains those agents. For example, the light transmitting member which contains the luminescent agent or agents must not degrade in sunlight so as to interfere with the operation of the device, such as by developing cracks or crazing which will divert the incident light, render the device less transparent, form peroxides or other decomposition materials which could be harmful to the luminescent agents themselves, and the like.

Accordingly, it is exceedingly difficult to find an overall combination of a number of materials which are optimum for solar collector requirements and still stand up to exposure to sunlight and other weather elements for a matter of years, even decades, without undue degradation. Even if such a combination of materials could be found, they most likely would be very expensive and might even have other objectionable features not yet known.

However, there are known luminescent agents whose properties and peculiarities are sufficently understood that they can be employed successfully in a solar collector, but these agents may not be as stable as desired and, therefore, do not maintain their efficiency over the large period of years desirable for solar collector installation. Generally, the known luminescent agents will diminish totally or at least in part in their ability to function in the manner desired for solar collectors. Some dyes are known to have a half life in sunlight of only a matter of weeks while others may last longer, e.g., one or more years, but they all lose some efficiency or even approach cessation of operation over long periods of time, such as ten years or more, and this causes a gradual and continuing decrease in the efficiency of the solar collector in its ability to generate electricity. Thus, it is very desirable to have a means by which this decreased efficiency is corrected.

Replacement of the entire solar collector is possible, but this is quite expensive and troublesome since such installations can be quite large. It is also wasteful because the photovoltaic cells themselves and other parts of the solar collector assembly have much longer useful lives than the luminescent agents themselves.

This invention allows for regeneration of the efficiency of the solar collector notwithstanding the decrease in efficiency with time of the original luminescent agents in the collector. This invention also allows for continued use of the original photovoltaic cells and other non or lesser deteriorating members of the assembly.

SUMMARY OF THE INVENTION

According to this invention there is provided a luminescent solar collector which contains a light transmitting member that carries at least one photovoltaic means thereon, a luminescent member removably attached to the light transmitting member and an interface material between the members which allows the aforesaid removable attachment of the members but which also essentially fills any space between the members, is essentially transparent and nonabsorbing to light, and has an index of refraction relative to the index of refraction of both members such that light will readily pass from one member to the other member through the interface material.

This invention also relates to a method for increasing the efficiency of an existing luminescent solar collector wherein the collector contains a luminescent member whose luminescent agents have lost a substantial portion of their efficiency, wherein there is attached to the low efficiency luminescent member a higher efficiency luminescent member by using an interface material between the members which interface material meets the requirements set forth hereinabove in the next preceeding paragraph.

Accordingly, it is an object of this invention to provide a new and improved luminescent solar collector whose luminescent efficiency can be improved or maintained at a high level during the entire life of the collector. It is another object to provide a new and improved method for improving the efficiency of a luminescent solar collector whose luminescent agents are deteriorating.

Other aspects, objects and advantages of this invention will be apparent to those skilled in the art from this disclosure and the appended claims.

DETAILED DESCRIPTION OF THE INVENTION

Figure 1:
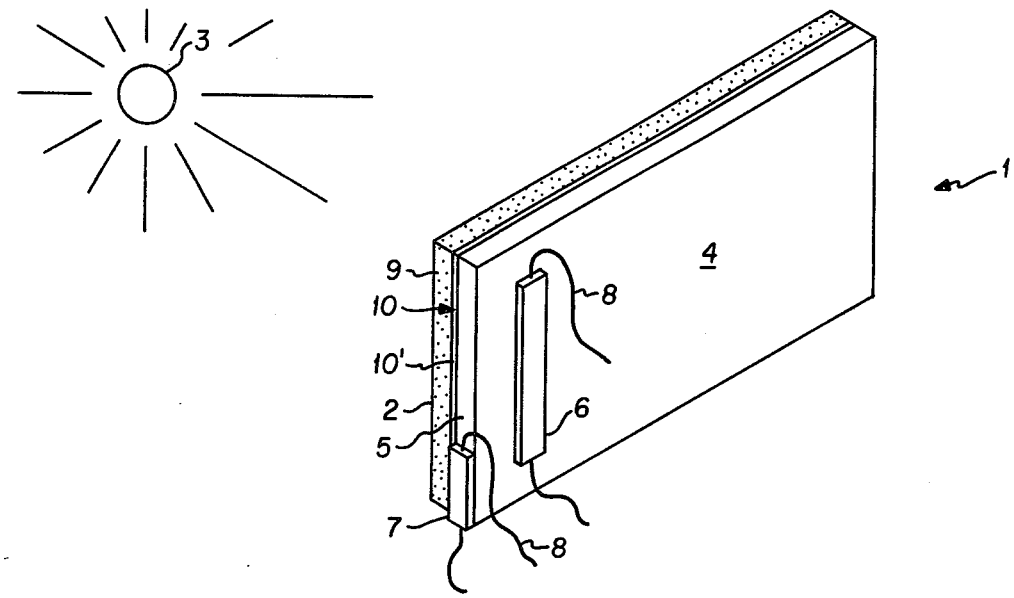
FIG. 1 shows one embodiment of a collector within this invention.

More specifically, FIG. 1 shows a luminescent solar collector 1 with its top side 2 facing sun 3 and its bottom side 4 facing more towards the viewer. Bottom side 4 is composed of a light transmitting member 5 which carries attached thereto photovoltaic cells 6 and 7, cell 6 being attached to bottom side 4 by known means such as silicone, polyvinylbutyrate, and the like, and cell 7 being attached in a like manner but to a thin upstanding edge face of member 5 rather than large area side 4. Wires 8 are connected to cells 6 and 7 for removal of electricity therefrom. If desired, photovoltaic cells can also be mounted on luminescent member 9 but these cells would be lost when member 9 is replaced as described hereinafter.

The photovoltaic cells used in this invention can be of any configuration and placed anywhere on member 5 desired. This includes the upper large area side of member 5 which opposes bottom side 4 even though such placement would put the cells in the interface between lower member 5 and upper luminescent member 9. Light transmitting member 5 can be an optically transparent material such as glass, plastic, and the like, or, if desired, include a luminescent agent or agents of its own. It matters not whether the luminescent agents in member 5 deteriorate because, as will be seen hereinafter in greater detail, luminescent member 9 is replaceable so that new, more efficient luminescent agents can later be added to collector 1.

As noted above, luminescent member 9 is placed on top of light transmitting member 5. Interface 10, where members 5 and 9 touch, or at least closely approach one another, is essentially filled with an interface material which is quite important to this invention because interface material 10' is what allows luminescent member 9 to be removable without sacrifice in efficiency of electricity recovery from wires 8.

Figures 3, 4:
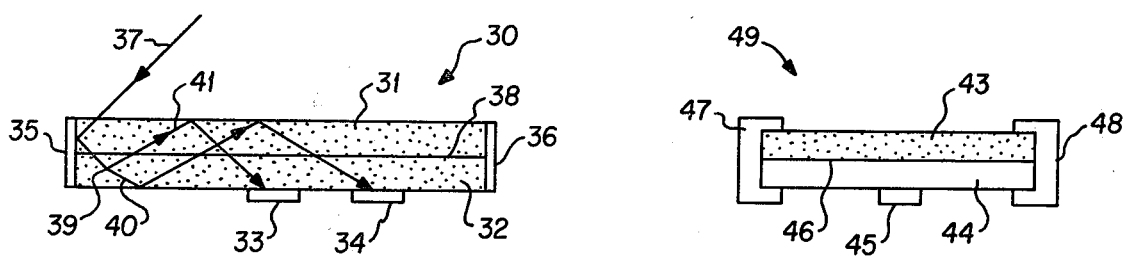
FIG. 3 shows a side view of another collector embodiment within this invention.
FIG. 4 shows yet another collector embodiment of this invention.
Figure 5:
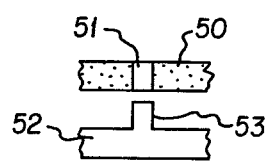
FIG. 5 shows a particular means for joining two members of a collector within this invention.

Ordinarily, although not necessarily for this invention, both members 5 and 9 will be essentially flat sheets, although there may be mechanical means such as that shown in FIGS. 4 and 5 for physically holding the members together. The two members, because of normal and unavoidable roughness or variations in thickness and the like, will have air gaps in interface 10 and these air gaps, if left in the final collector assembly would substantially interfere with the passage of light between members 5 and 9 because of the substantially different index of refraction of air as compared to the index for either of members 5 and 9. Member 9 can be composed of the same basic material, i.e., glass, plastic, and the like, as member 5 and, in fact, the only material difference between the two members could be that one contains luminescent agents and one does not. Or, there could be no difference in that both members contain the same luminescent agents and matrix material. Thus, the index of refraction for members 5 and 9 will be the same or very similar, the problem being interface 10.

In accordance with this invention interface 10 is essentially filled with a carefully selected interface material 10' which meets the requirements that it is fluid enough to fill the air gaps between members 5 and 9, is essentially optically transparent, is essentially nonabsorbing to light, and has an index of refraction relative to the indices of refraction of members 5 and 9 such that light will readily pass from one member to the other member through the interface material. This will be discussed in greater detail with reference to FIG. 2. Interface material 10' can be a viscous fluid used alone, or in combination with one or more layers of solid conforming materials such as a plastic film, which meets the requirements above. The fluid interface material 10' preferably wets the surface of members 5 and 9 for better filling of voids between the two members. Generally, any material which fits the above requirements can be employed in this invention and therefore a very broad range of chemical materials could be employed; for example, low molecular weight fluid polymers such as polybutenes, e.g., polyisobutylene, which are polymerized not to the solid state but rather to a viscous fluid state like that normally employed in industry for use in pressure sensitive adhesives. A wide variety of polymeric and other materials can be employed and will be readily apparent to one skilled in the art when apprised of the above functional requirements for interface material 10'. Solid conforming materials can be polymeric films such as polyester films and the like.

If a pressure sensitive adhesive type interface material is employed, this material can also serve the function of attaching member 9 to member 5 in a removable manner. Of course, physical attachment as described hereinafter with respect to FIG. 4 can be employed in place of, or in addition to, a pressure sensitive adhesive type interface material. Physical attachment can be employed by itself without the interface material providing any removable attaching function.

Figure 2:
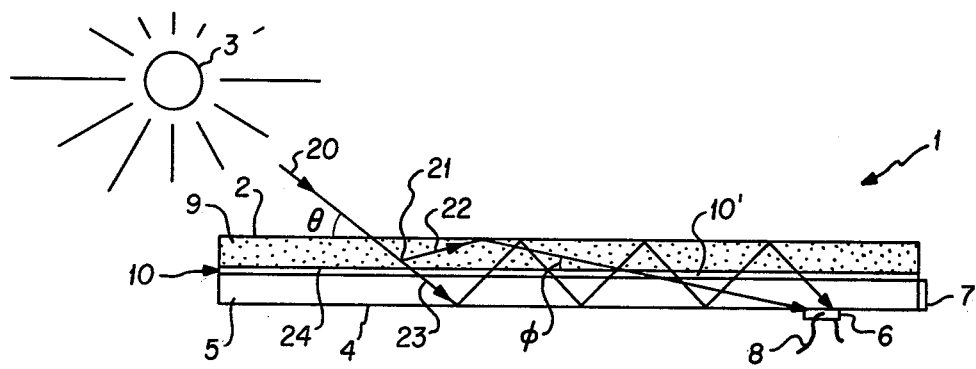
FIG. 2 shows a side view of the collector of FIG. 1.

FIG. 2 shows an edge view of collector 1. FIG. 2 shows a ray of sunlight 20 impinging upon upper surface 2 of luminescent member 9 and passing into the interior of luminescent member 9 until it reaches a luminescent agent particle 21, at which time it is absorbed and a large number of subrays re-emitted by the luminescent agent, only two of which, subrays 22 and 23, are shown for sake of simplicity. It should be noted that, in operation, the collectors of this invention can receive and utilize to generate electricity, light from either the luminescent member side or the light transmitting member side or both.

Subray 22 reflects internally off upper surface 2 because it is traveling at a different angle $\phi$, which is a smaller angle, than the original angle of incidence $\theta$ of light ray 20. After such internal reflection, subray 22 passes through member 9 and easily passes through interface 10 since interface 10 is filled with a material 10' that is light transmitting, non-absorbing, and has an index of refraction similar to that of members 5 and 9, and thence through member 5 to photovoltaic cell 6 for the generation of electricity from its photon energy. The indices of refraction of members 5 and 9 can be the same or different. The index of refraction of interface material 10' is preferably (1) the same as members 5 and 9 when those members have the same indices, or (2) the same as one of members 5 and 9 or between members 5 and 9 when those members have differing indices.

Similarly, subray 23 is internally reflected a number of times until it too reaches photovoltaic cell 6. This is repeated innumerable times for the innumerable particles of luminescent agent dispersed throughout member 9 so that, in effect, light is concentrated on the photovoltaic cells because of the luminescent function.

Because of the carefully chosen characteristics of interface material 10' as outlined for this invention, light readily passes between members 5 and 9 until it does finally reach a photovoltaic cell. Thus, internal reflection within the collector as a whole is enhanced by this invention, notwithstanding the optical interruption and barrier presented by an interface between members 5 and 9.

According to this invention, the plurality of members perform as a single unit but, when the luminescent agents in member 9 deteriorate to a point that the efficiency of the collector as a whole is unduly impaired, member 9 can be removed and replaced by a new member with fresh, highly efficient luminescent agents therein. Only luminescent agents and the matrix material of member 9 are replaced, thereby keeping for longer use member 5 and photovoltaic cells 6 and 7. Were it not for the requirements set forth above for the interface material of this invention, subrays 22 and 23 could readily be reflected from bottom side 24 of member 9 back out through upper side 2 or reflected internally only within member 9 so that the subrays would never penetrate interface 10 and reach cells 6 or 7. By use of interface material 10', most of the light reaching bottom side 24 will not be reflected but rather will readily pass through interface 10 and into member 5.

In accordance with this invention, once member 9 substantially decreases in efficiency, it is peeled off from member 5, additional interface material 10' applied to member 5, and a new member 9 with fresh luminescent agents attached to member 5. During this replacement procedure special care should be taken to be sure that air pockets are not introduced in interface 10. If interface material 10' is a pressure sensitive adhesive, pressure or other types of working with a roller or the like can be employed to work air bubbles out of interface 10, similar reasoning applying when interface material 10' is supplemented with a solid polymeric film or the like.

Interface material 10' is, and essentially remains during its useful life, a fluid which will flow slowly so it can be desirable to put a containment means around the edge faces of collector 1 to keep interface material 10' from extruding out from between the members. The containment means can be any type of solid material but is preferably a reflective material such as a mirror, a shiny metal, or the like.

FIG. 3 shows a luminescent solar collector 30 with an upper luminescent member 31 and a lower light transmitting member 32 which also contains luminescent agents. Member 32 carries on the bottom side thereof two photovoltaic cells 33 and 34. The left and right edge faces of collector 30 are covered by containment means 35 and 36, respectively, which are in this embodiment reflective mirrors. The other two edge faces of collector 30 also carry containment means similar to those shown for elements 35 and 36.

A ray of light 37 passing into member 31 reflects off containment means 35, passes through interface material 38 and into member 32, until it hits luminescent agent particle 39, after which a plurality of subrays are emitted, two of which are shown as subrays 40 and 41. Subrays 40 and 41 are internally reflected as described hereinabove until they reach cells 33 and 34.

FIG. 4 shows upper luminescent member 43, lower light transmitting member 44 which is nonluminescent, and photovoltaic cell 45 on member 44. Although members 43 and 44 have an interface material 46 therebetween in accordance with this invention, the interface material in this embodiment is not an adhesive type material and, therefore, does not contribute to the removable fixing of members 43 and 44 together. The removable-fixing function is provided by mechanical clamps 47 and 48 which cover all or part of the edge faces of collector 49. Mechanical clamping does not always assure the closest approach of members 43 and 44 in all places, but this is not a problem with this invention because interface material 46 fills those voids and thereby accommodates for any possible looseness of fixing. Clamps 47 and 48 can also serve as a containment means and/or reflective means as desired.

FIG. 5 shows a portion of a luminescent member 50 with an aperture 51 therein. FIG. 5 also shows a portion of a light transmitting member 52 with a projection 53 thereon, projection 53 fitting into aperture 51 to allow for physical fixing of the two members together.

The light transmitting member matrix material and the luminescent member matrix material can be the same or different but are preferably a polymeric or glass material which is transparent at least to the visible light spectrum. Such matrix material can therefore be of conventional plastic polymeric material such as polymethylmethacrylate, other known acrylic polymers, styrene polymers, and the like. The material can be glass or other transparent material into which luminescent agents can be incorporated and which, like the polymeric material, is nondeleterious to the luminescent agents, the photovoltaic cells, and the like. The matrix material can be any light transmitting material heretofore used in the manufacture of conventional nonluminescent photovoltaic devices. The matrix materials preferable do not contain impurities such as iron and the like which would absorb light rather than allow it to pass on to the photovoltaic cell.

The luminescent agents can include metals or oxides or other compounds of metals, such as neodymium oxide employed in a glass matrix, or one or more laser dyes such as the coumarin family of dyes and the rhodamine family of dyes. These dyes are quite complex chemically. All of these materials and the characteristics thereof are well known in the art and are commercially available so that further detailed description is unnecessary to inform one skilled in the art.

The luminescent agent or agents are simply dispersed in the matrix material by mixing or other dispersion while the matrix material is in a fluid state due to heating and the like.

Photovoltaic cells are well known in the art and vary widely as to their characteristics and can include, without limitation, silicon, cadmium sulfide, germanium, gallium arsenide, and many other known semiconductor materials.

This invention also provides a method for increasing the efficiency of an existing luminescent solar collector when the existing luminescent member may or may not be removable but whose luminescent agent or agents have nevertheless lost a substantial portion of their original efficiency, the improvement comprising attaching to the low efficiency, original luminescent member, normally over the top thereof, a higher efficiency new luminescent member. The attaching is accomplished using an interface material as described hereinabove so that the interface material essentially fills any interface gap between the original luminescent member and the new luminescent member, the interface material being essentially transparent and nonabsorbing to light and having an index of refraction relative to the indices of refraction of said luminescent members such that light will readily pass from one member to the other member through the interface material. Interface material requirements and variations as described hereinabove also apply to this embodiment of the invention. For example, the interface material can perform an attaching function if it is a pressure sensitive adhesive but this is not necessary. Containment means can be employed which are reflective or not reflective as desired as described above.

Reasonable variations and modifications are possible within the scope of this disclosure without departing from the spirit and scope of this invention.

The embodiments of the invention in which an exclusive property or privilege is claimed are defined as follows:

1. A luminescent solar collector comprising a light transmitting member which carries at least one photovoltaic means, a luminescent member removably attached to said light transmitting member, a fluid interface material between said members, said interface material essentially filling any space between said light transmitting member and said luminescent member, said interface material being essentially transparent and nonabsorbing to light and having an index of refraction relative to the index of refraction of said light transmitting member and said luminescent member such that light will readily pass from one member to the other member through said interface material, and said interface material being supplemented with a solid, conforming material.

2. A collector according to claim 1 wherein containment means are carried around the edge faces of said collector to keep said interface material between said members.

3. A collector according to claim 2 wherein said containment means are reflective.

4. A collector according to claim 1 wherein said interface material is a pressure sensitive adhesive.

5. A collector according to claim 1 wherein said solid conforming material is a polymeric film.

6. A collector according to claim 5 wherein said members are physically clamped together under pressure against opposing sides of said interface material.

7. A collector according to claim 5 wherein said polymeric film carries pressure sensitive adhesive on both sides thereof for contact with both said members.

8. A collector according to claim 1 wherein said members are physically clamped together against opposing sides of said interface material.

9. In a method for increasing the efficiency of a luminescent solar collector, said collector containing a luminescent member whose luminescent agents have lost a portion of their original efficiency, the improvement comprising attaching to said lower efficiency luminescent member a higher efficiency luminescent member with a fluid interface material between said members, said interface material being essentially transparent and nonabsorbing to light and having an index of refraction relative to the index of refraction of said luminescent members such that light will readily pass from one member to the other member through said interface material.

10. A method according to claim 9 wherein said interface material attaches said luminescent members together.

11. A method according to claim 10 wherein said interface material is a pressure sensitive adhesive.

12. A method according to claim 9 wherein said interface material is supplemented with a solid conforming material.

13. A method according to claim 12 wherein said solid conforming material is a polymeric film.

14. A method according to claim 12 wherein containment means are attached around the edges of said collector to keep said interface material between said members.

15. A method according to claim 14 wherein said containment means are reflective.

* * * * *